United States Patent
Zhang

(10) Patent No.: US 8,283,788 B2
(45) Date of Patent: *Oct. 9, 2012

(54) METHOD OF FABRICATING SEMICONDUCTOR DEVICE

(75) Inventor: Hongyong Zhang, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/883,526

(22) Filed: Sep. 16, 2010

(65) Prior Publication Data

US 2011/0001192 A1   Jan. 6, 2011

Related U.S. Application Data

(60) Continuation of application No. 11/211,694, filed on Aug. 26, 2005, now Pat. No. 7,800,235, which is a continuation of application No. 09/362,808, filed on Jul. 28, 1999, now Pat. No. 7,786,553, which is a division of application No. 08/753,428, filed on Nov. 25, 1996, now Pat. No. 5,940,732.

(30) Foreign Application Priority Data

Nov. 27, 1995 (JP) .................................. 7-332629

(51) Int. Cl.
  *H01L 23/48* (2006.01)
(52) U.S. Cl. .. 257/774; 257/347; 257/775; 257/E21.577
(58) Field of Classification Search .................. 257/347, 257/774, 775
See application file for complete search history.

(56) References Cited

U.S. PATENT DOCUMENTS

| | | | |
|---|---|---|---|
| 4,040,083 A | 8/1977 | Saiki et al. |
| 4,103,297 A | 7/1978 | McGreivy et al. |
| 4,334,349 A | 6/1982 | Aoyama et al. |
| 4,342,617 A | 8/1982 | Fu et al. |
| 4,365,264 A | 12/1982 | Mukai et al. |
| 4,371,423 A | 2/1983 | Yoshizawa et al. |
| 4,404,733 A | 9/1983 | Sasaki |
| 4,461,672 A | 7/1984 | Musser |
| 4,495,220 A | 1/1985 | Wolf et al. |
| 4,814,041 A | 3/1989 | Auda |
| 5,003,356 A | 3/1991 | Wakai et al. |

(Continued)

FOREIGN PATENT DOCUMENTS

EP   0263220 A   4/1988

(Continued)

OTHER PUBLICATIONS

"An Organic low dielectric constant film is going to be developed for 0.18-0.13 μm,", NIKKEI Microdevices, Nov. 1, 1995, No. 125, pp. 140-141.

(Continued)

*Primary Examiner* — Wai Sing Louie
(74) *Attorney, Agent, or Firm* — Fish & Richardson P.C.

(57) ABSTRACT

Method of fabricating thin-film transistors in which contact with connecting electrodes becomes reliable. When contact holes are formed, the bottom insulating layer is subjected to a wet etching process, thus producing undercuttings inside the contact holes. In order to remove the undercuttings, a light etching process is carried out to widen the contact holes. Thus, tapering section are obtained, and the covering of connection wiring is improved.

13 Claims, 6 Drawing Sheets

U.S. PATENT DOCUMENTS

| | | | |
|---|---|---|---|
| 5,032,883 A | 7/1991 | Wakai et al. |
| 5,055,906 A | 10/1991 | Mase et al. |
| 5,056,895 A | 10/1991 | Kahn |
| 5,084,905 A | 1/1992 | Sasaki et al. |
| 5,117,278 A | 5/1992 | Bellersen et al. |
| 5,132,386 A | 7/1992 | Suzuki et al. |
| 5,155,053 A | 10/1992 | Atkinson |
| 5,200,846 A | 4/1993 | Hiroki et al. |
| 5,231,054 A | 7/1993 | Kosugi |
| 5,235,195 A | 8/1993 | Tran et al. |
| 5,264,077 A | 11/1993 | Fukui et al. |
| 5,264,731 A | 11/1993 | Tamura et al. |
| 5,287,205 A | 2/1994 | Yamazaki et al. |
| 5,308,998 A | 5/1994 | Yamazaki et al. |
| 5,320,981 A | 6/1994 | Blalock |
| 5,327,001 A | 7/1994 | Wakai et al. |
| 5,414,442 A | 5/1995 | Yamazaki et al. |
| 5,453,403 A | 9/1995 | Meng et al. |
| 5,453,858 A | 9/1995 | Yamazaki |
| 5,492,843 A | 2/1996 | Adachi et al. |
| 5,495,353 A | 2/1996 | Yamazaki et al. |
| 5,529,937 A | 6/1996 | Zhang et al. |
| 5,550,405 A | 8/1996 | Cheung et al. |
| 5,552,343 A | 9/1996 | Hsu |
| 5,568,288 A | 10/1996 | Yamazaki et al. |
| 5,585,951 A | 12/1996 | Noda et al. |
| 5,604,380 A | 2/1997 | Nishimura et al. |
| 5,612,799 A | 3/1997 | Yamazaki et al. |
| 5,614,732 A | 3/1997 | Yamazaki |
| 5,620,905 A | 4/1997 | Konuma et al. |
| 5,620,910 A | 4/1997 | Teramoto |
| 5,621,556 A | 4/1997 | Fulks et al. |
| 5,683,938 A | 11/1997 | Kim et al. |
| 5,717,224 A | 2/1998 | Zhang |
| 5,719,065 A | 2/1998 | Takemura et al. |
| 5,721,601 A | 2/1998 | Yamaji et al. |
| 5,753,952 A | 5/1998 | Mehrad |
| 5,784,073 A | 7/1998 | Yamazaki et al. |
| 5,837,619 A | 11/1998 | Adachi et al. |
| 5,841,195 A | 11/1998 | Lin et al. |
| 5,847,410 A | 12/1998 | Nakajima |
| 5,849,611 A | 12/1998 | Yamazaki et al. |
| 5,859,683 A | 1/1999 | Tagusa et al. |
| 5,879,974 A | 3/1999 | Yamazaki |
| 5,880,038 A | 3/1999 | Yamazaki et al. |
| 5,905,555 A | 5/1999 | Yamazaki et al. |
| 5,925,421 A | 7/1999 | Yamazaki et al. |
| 5,933,205 A | 8/1999 | Yamazaki et al. |
| 5,940,732 A | 8/1999 | Zhang |
| 5,946,059 A | 8/1999 | Yamazaki et al. |
| 5,946,065 A | 8/1999 | Tagusa et al. |
| 5,952,708 A | 9/1999 | Yamazaki |
| 5,953,084 A | 9/1999 | Shimada et al. |
| 5,956,105 A | 9/1999 | Yamazaki et al. |
| 5,963,278 A | 10/1999 | Yamazaki et al. |
| 5,977,562 A | 11/1999 | Hirakata et al. |
| 5,986,738 A | 11/1999 | Tagusa et al. |
| 5,990,491 A | 11/1999 | Zhang |
| 6,015,724 A | 1/2000 | Yamazaki |
| 6,027,960 A | 2/2000 | Kusumoto et al. |
| 6,051,453 A | 4/2000 | Takemura |
| 6,052,162 A | 4/2000 | Shimada et al. |
| 6,071,764 A | 6/2000 | Zhang et al. |
| 6,077,758 A | 6/2000 | Zhang et al. |
| 6,096,581 A | 8/2000 | Zhang et al. |
| 6,097,452 A | 8/2000 | Shimada et al. |
| 6,140,705 A | 10/2000 | Liu |
| 6,147,375 A | 11/2000 | Yamazaki et al. |
| 6,157,064 A | 12/2000 | Huang |
| 6,195,138 B1 | 2/2001 | Shimada et al. |
| 6,204,907 B1 | 3/2001 | Hiraishi et al. |
| 6,310,362 B1 | 10/2001 | Takemura |
| 6,433,851 B2 | 8/2002 | Shimada et al. |
| 6,455,401 B1 | 9/2002 | Zhang et al. |
| 6,475,903 B1 | 11/2002 | Gardner |
| 6,534,832 B2 | 3/2003 | Takemura |
| 6,692,899 B2 * | 2/2004 | Lai ................ 430/311 |
| 6,900,462 B2 | 5/2005 | Suzawa et al. |
| 6,924,213 B2 | 8/2005 | Zhang et al. |
| 6,936,847 B2 | 8/2005 | Tanabe et al. |
| 7,056,775 B2 | 6/2006 | Zhang et al. |
| 7,190,428 B2 | 3/2007 | Yamazaki |
| 7,786,553 B1 | 8/2010 | Zhang |
| 7,800,235 B2 * | 9/2010 | Zhang .................. 257/775 |
| 2003/0218215 A1 | 11/2003 | Takemura |
| 2006/0060861 A1 | 3/2006 | Yamazaki et al. |
| 2006/0113541 A1 | 6/2006 | Takemura |

FOREIGN PATENT DOCUMENTS

| | | |
|---|---|---|
| EP | 0603866 A | 6/1994 |
| JP | 63-013347 A | 1/1988 |
| JP | 63-034928 A | 2/1988 |
| JP | 63-104338 A | 5/1988 |
| JP | 63-296353 A | 12/1988 |
| JP | 64-033971 A | 2/1989 |
| JP | 01-286443 A | 11/1989 |
| JP | 02-025024 A | 1/1990 |
| JP | 02-044769 A | 2/1990 |
| JP | 02-278749 A | 11/1990 |
| JP | 03072623 A | 3/1991 |
| JP | 03-286524 A | 12/1991 |
| JP | 04-007858 A | 1/1992 |
| JP | 04-076915 A | 3/1992 |
| JP | 04-116954 A | 4/1992 |
| JP | 04-142740 A | 5/1992 |
| JP | 04-155834 A | 5/1992 |
| JP | 04-251926 A | 9/1992 |
| JP | 04-358129 A | 12/1992 |
| JP | 05-275373 A | 10/1993 |
| JP | 06-104281 A | 4/1994 |
| JP | 06-175156 A | 6/1994 |
| JP | 06-177155 A | 6/1994 |
| JP | 06-242433 A | 9/1994 |
| JP | 07-056190 A | 3/1995 |
| JP | 07-058107 A | 3/1995 |
| JP | 07-094757 A | 4/1995 |
| JP | 07-099324 A | 4/1995 |
| JP | 07-131034 A | 5/1995 |
| JP | 07-161816 A | 6/1995 |
| JP | 07-245405 A | 9/1995 |
| JP | 09213968 A | 8/1997 |
| NL | 7314375 | 4/1974 |

OTHER PUBLICATIONS

"Office Action (U.S. Appl. No. 09/362,808; US03155D1 (U03603) Dated May 4, 2006,".

"Office Action (U.S. Appl. No. 09/362,808; US03155D1 (U03603) Dated Oct. 17, 2005,".

"Office Action (U.S. Appl. No. 09/362,808; US03155D1 (U03603) Dated Apr. 6, 2005,".

"Office Action (U.S. Appl. No. 09/382,808; US03155D1 (U03603) Dated Oct. 4, 2004,".

"Advisory Action (U.S. Appl. No. 09/362,808; US03155D1 (U03603)) Dated Sep. 12, 2002,".

"Office Action (U.S. Appl. No. 09/362,808; US03155D1 (U03603) Dated May 1, 2002,".

"Office Action (U.S. Appl. No. 09/362,808; US03155D1 (U03603) Dated Nov. 5, 2001,".

"Office Action (U.S. Appl. No. 09/362,808; US03155D1 (U03603) Dated Mar. 7, 2001,".

"Trial Decision (Application No. 2003-70819;J7025) Dated Jan. 19, 2010,".

\* cited by examiner

PHOSPHOROUS IONS

METHOD OF FABRICATING SEMICONDUCTOR DEVICE

CROSS-REFERENCE TO RELATED APPLICATIONS

This application is a continuation of U.S. application Ser. No. 11/211,694, filed Aug. 26, 2005, now allowed, which is a continuation of U.S. application Ser. No. 09/362,808, filed Jul. 28, 1999, now U.S. Pat. No. 7,786,553, which is a divisional of U.S. application Ser. No. 08/753,428, filed Nov. 25, 1996, now U.S. Pat. No. 5,940,732, which claims the benefit of a foreign priority application filed in Japan as Serial No. 7-332629 on Nov. 27, 1995, all of which are incorporated by reference.

BACKGROUND OF THE INVENTION

1. Field of the Invention

The present invention relates to a method of fabricating a semiconductor device, using a crystalline thin-film semiconductor and, more particularly, to a method of fabricating planar type thin-film transistors.

2. Description of Related Art

In recent years, techniques for fabricating thin-film transistors (TFTs) on cheap glass substrates have evolved rapidly, because there is an increasing demand for active matrix liquid crystal displays.

An active matrix liquid crystal display has millions of pixels arranged in rows and columns. TFTs are arranged at these pixels. Electric charge going in and out of each electrode at the pixels is controlled by the switching action of the TFTs.

Therefore, if one TFT fails to operate, then pixel electrodes connected with the faulty TFT do not act as display elements. This gives rise to a so-called point defect. For example, in the case of a normally black liquid crystal display, when white color is displayed, the point defect appears as a black point, which is deeply harmful to the appearance. Furthermore, it has been required that a circuit (known as a peripheral driver circuit) for driving TFTs for displaying these pixel electrodes be formed out of TFTs integrated with the former TFTs on the same glass substrate.

In this case, if one driving TFT fails to operate, all TFTs applied with a driving voltage from the faulty TFT do not act as switching elements. This results in a so-called line defect. This is a fatal hindrance to the liquid crystal display.

Accordingly, in an active matrix liquid crystal display, millions of TFTs must operate normally and stably over a long term. However, the present situation is that it is difficult to eliminate point defects and line defects perfectly. One of the causes is poor contact. Poor contact is that an interconnect electrode is poorly electrically connected with an associated TFT at a contact location, thus a defective operation is occurred. Especially, in the case of a planar TFT, poor contact presents serious problems, because an interconnect electrode is electrically connected with an associated TFT through a thin contact hole.

The poor contact is a main cause of premature deterioration of semiconductor device characteristics. Especially, where large currents flow or the device is operated at high temperatures, the deterioration coursed by the poor contact is promoted. Therefore, it is said that the reliability of contacts determines the reliability of the semiconductor device.

Generally, in the case of pixel display regions of an active matrix liquid crystal display, the gate electrodes are brought out of the pixel display regions directly and so no contacts exist. That is, contact with the pixel electrodes is very important for the reliability of the liquid crystal display.

In the case of a peripheral driver circuit, very many (from tens of thousands to millions) contacts exist. Especially, because there exist gate electrode contacts, and because the temperature is elevated by large-current operation, the contacts must have higher reliability than the pixel display regions.

SUMMARY OF THE INVENTION

The causes of poor contact are classified into three major categories.

The first category is that a conductive film forming interconnect electrodes is not in ohmic contact with a semiconductor film forming the source/drain regions of TFTs. This is caused by formation of an insulating coating such as a metal oxide at the junction plane. Also, the states of the vicinities of the semiconductor film surface (doping concentration, defect level density, cleanliness, and so on) greatly affect the performance of the contacts.

The second category is that the conductive film forming the interconnect electrodes has poor coverage and thus the interconnect line breaks within a contact hole. In this case, it is necessary to improve the situation by the method of forming the interconnect electrodes or changing the film growth conditions better.

The third category is that an interconnect electrode breaks due to the cross-sectional shape of the contact hole. The cross-sectional shape of the contact hole depends heavily on the conditions under which the insulators (SiN, $SiO_2$, etc.) covered with the contact portions are etched.

In order to form contacts with good coverage, it is desired to have a continuously mildly changing cross-sectional shape, or a tapering shape. Overetch of the underlying films (wedge-shape recess) which is often encountered with insulating films between plural layers severely deteriorates the coverage.

It is an object of the present invention to provide a semiconductor device having contact holes through which interconnect electrodes are electrically connected with TFTs, the device being characterized in that the contact holes have improved cross-sectional shape, whereby reducing malfunctions of the TFTs which would normally be caused by poor contact.

It is a more specific object of the invention to provide a liquid crystal display having contacts of improved reliability, whereby the liquid crystal display has improved long-term reliability.

It is another object of the invention to provide a method of fabricating semiconductor devices with an improved yield by eliminating point defects and line defects.

One aspect of the invention lies in a method of fabricating a thin-film transistor comprising a gate region having a gate electrode made of a material capable of being anodized and source/drain regions made of a semiconductor. This method comprises the steps of: forming a multilayer insulating film comprises at least two layers which have a common constituent over said gate region and over said source/drain regions; and forming holes in said multilayer insulating film by dry etching techniques so as to form tapered sections having tilt angles which decrease successively from said top insulating layer toward said bottom insulating layer.

In one feature of the invention, the dry etch rates of the interlayer insulating films are controlled so as to form tapered sections. As a result, the tilt angles of the cross-sectional shape of the contact holes decrease successively from the top layer toward the bottom layer. The tilt angles of the bottom layer and the top layer are indicated by α and β, respectively, in FIG. 3.

It is only necessary that the insulating films act only as interlayer insulating films and so they can be made from various materials such as silicon oxide, silicon nitride, and organic resins.

Preferably, the used material permits easy control of the dry etch rates, because desired taper can be readily accomplished by making the etch rate of the upper layer higher than that of the lower layer.

Generally, where contact holes are formed by dry etching techniques, reactive ion etching (RIE) is used. However, RIE has the disadvantage that if the instant (known as endpoint) at which the etching process ends is not clear, then a conductive thin film to which contact should be made is also etched away.

In the case of RIE, it is conventional to detect light emission due to a plasma in order to detect the endpoint. Specifically, certain radicals or ions produced during etching are monitored.

In this case, an interlayer insulating film consisting of silicon oxide which is formed on a gate-insulating film made of silicon oxide, for example, is etched. Light-emitting species to be monitored are mixed. This makes it difficult to confirm the endpoint.

Where the foregoing is taken into consideration, it is necessary that a insulating film used as an interlayer insulating film be selected, taking full account of the structure of the fabricated TFTs.

Another aspect of the invention lies in a method of fabricating a thin-film transistor comprising a gate region having a gate electrode made of a material capable of being anodized and source/drain regions made of a semiconductor. This method comprises the steps of: forming a thin film; forming a insulating film having a bottom surface over said gate region and over said source/drain regions such that said thin film is in contact with the bottom surface of said insulating film; forming holes in said insulating film by dry etching techniques; etching said thin film in contact with the bottom surface of said insulating film; and subjecting said holes to a light etching process.

In another feature of the invention, the contact holes are widened by the light etching process. Tapered section are formed around the tops of the contact holes.

If the thin film in contact with the bottom surface of the insulating film is etched by dry etching techniques, the insulating film is undercut because of isotropic etching. Hence, holes are formed. The undercutting will give rise to overetch, which in turn permits the interconnect electrodes to break later.

In the present invention, the light etching process can widen the contact holes by removing the undercutting inside the contact holes.

The light etching process is carried out with a higher $O_2$ content than during the step of forming the contact holes.

This eliminates overetch and, at the same time, causes resist mask for forming the contact holes to be recessed. The corners at the edges (the outer frames around the entrances to the contact holes) are rounded off.

That is, this light etching process results in contact holes having a cross-sectional shape which falls along a mild curve. Consequently, the coverage of the interconnect electrodes is quite good.

DETAILED DESCRIPTION OF THE EMBODIMENTS

Embodiment 1

Figure 1A:
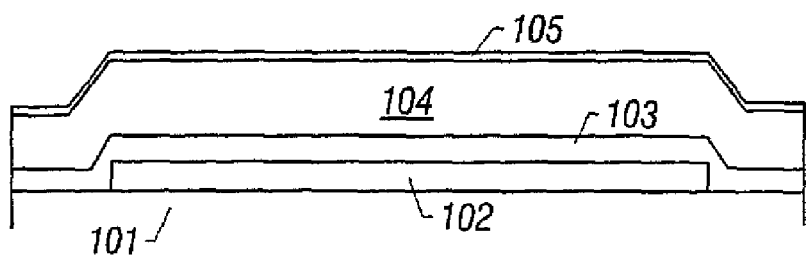
FIGS. 1(A)-1(D) and 2(A)-2(D) are cross-sectional views of a semiconductor device, illustrating a process sequence for fabricating the device by a method according to the present invention.

A process sequence for fabricating TFTs in accordance with the present invention is illustrated in FIGS. 1(A)-1(D) and FIG. 2(A)-2(D).

First, a glass substrate 101 having an insulating film such as a silicon oxide film on its surface is prepared. An amorphous silicon film (not shown) having a thickness of 500 Å is formed on the substrate by plasma CVD or LP thermal chemical vapor deposition. The amorphous film is crystallized by an appropriate crystallization method, which may be either heating or laser illumination.

Then, the crystalline silicon film obtained by crystallizing the amorphous silicon film is patterned into islands of a semiconductor layer 102 forming an active layer.

A silicon oxide film 103 which will act as a gate-insulating film later is formed on the semiconductor layer to a thickness of 1200 Å by plasma CVD or LP thermal chemical vapor deposition.

Then, a film 104 consisting only or mainly of aluminum is formed to a thickness of 4000 Å. This film 104 will act as a gate electrode later. Of course, other materials capable of being anodized such as tantalum and niobium may also be used.

Thereafter, anodization is carried out within an electrolytic solution, using the aluminum film 104 as an anode. The electrolytic solution is neutralizing 3% ethylene glycol solution of tartaric acid with aqueous ammonia and adjusting it to a pH of 6.92. Using a platinum cathode, the liquid is processed with an electric current of 5 mA. The voltage is increased up to 10 V.

A dense anodic oxide film 105 formed in this way acts to improve the adhesion to photoresist later. The thickness of the anodic oxide film 105 can be controlled by controlling the voltage application time (FIG. 1(A)).

Then the aluminum film 104 is patterned to formed a gate electrode (not shown).

Then, a second anodic oxidation process is carried out to form a porous anodic oxide film 106. As an electrolytic solution, 3% aqueous solution of oxalic acid is used. A platinum cathode is employed. It is processed with an electric current of 2 to 3 mA. The voltage is increased up to 8 V.

At this time, the anodic oxidation progresses parallel to the substrate. The width of the porous anodic oxide film 106 can be controlled by the voltage application time.

Figure 1B:
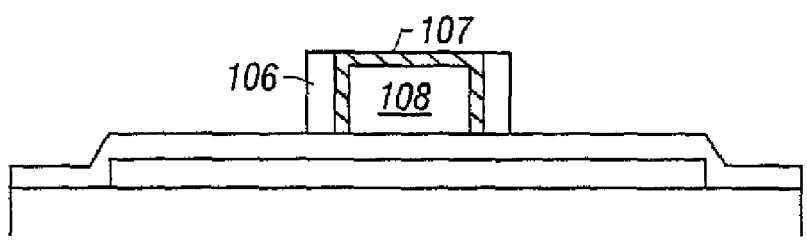

After removing the photoresist with appropriate peeling liquid, a third anodic oxidation process is performed, thus obtaining a state shown in FIG. 1(B).

At this time, the electrolytic solution is neutralizing 3% ethylene glycol solution of tartaric acid with aqueous ammonia and adjusted to a pH of 6.92. Using a platinum cathode, the anodic oxidation is performed with an electric current of 5 to 6 mA. The voltage is increased up to 100 V.

The resulting anodic oxide film 107 is very dense and firm. Therefore, this protects the gate electrode 108 from damage in later steps such as implantation step.

The firm anodic oxide film 107 is not readily etched and so the etching time is prolonged when contact holes are formed. Therefore, it is desired to suppress the thickness of the film below 1000 Å.

Then, a dopant is implanted into the islands of semiconductor layer 102 by the ion implantation process. For example, when an N-channel TFT is manufactured, phosphorus (P) may be used as the dopant.

First, under the condition of FIG. 1(B), a first ion implantation process is carried out. Phosphorus (P) is implanted at an accelerating voltage of 60 to 90 kV at a dose of 0.2 to $5 \times 10^{15}$ atoms/cm$^2$. In the present example, the accelerating voltage is 80 kV, and the dose is $1 \times 10^{15}$ atoms/cm$^2$.

Using the gate electrode 108 and the porous anodic oxide film 106 as masks. Regions 109 and 110 which will become source/drain regions are formed by self-aligned technology.

Figure 1C:
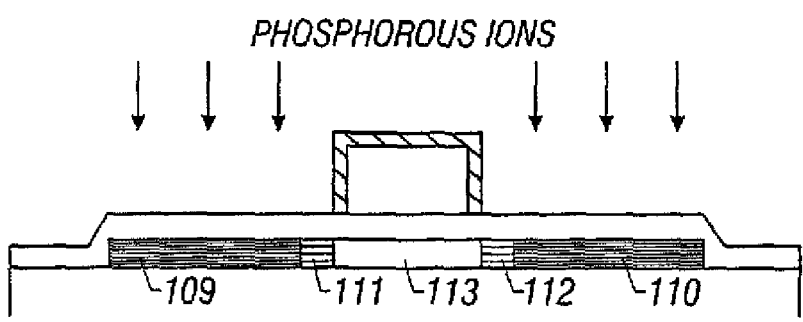

Then, as shown in FIG. 1(C), the porous anodic oxide film 106 is removed, and a second implantation process is performed. The second incorporation of phosphorus (P) is carried out at an accelerating voltage of 60 to 90 kV at a dose of 0.1 to $5 \times 10^{14}$ atoms/cm$^2$. In the present example, the accelerating voltage is 80 kV, and the dose is $1 \times 10^{14}$ atoms/cm$^2$.

The gate electrode 108 serves as a mask. Regions 111 and 112 more lightly doped than the source drain 109 and drain region 110 are formed by self-aligned technology.

At the same time, a region 113 acting as a channel for the TFT is formed by self-aligned technology, because no dopant is implanted at all right under the gate electrode 108.

The lightly doped drain (LDD) regions 112 formed in this way suppress generation of a high electric field between the channel region 113 and the drain region 110.

Then, irradiating with KrF excimer laser light and thermally annealing are performed. In the present example, the energy density of the laser light is 250 to 300 mJ/cm$^2$. The thermal annealing is carried out at 300 to 450° C. for 1 hour.

This step can heal the damage to the crystallinity of the islands of semiconductor layer 102 sustained by the ion implantation process.

Figure 1D:
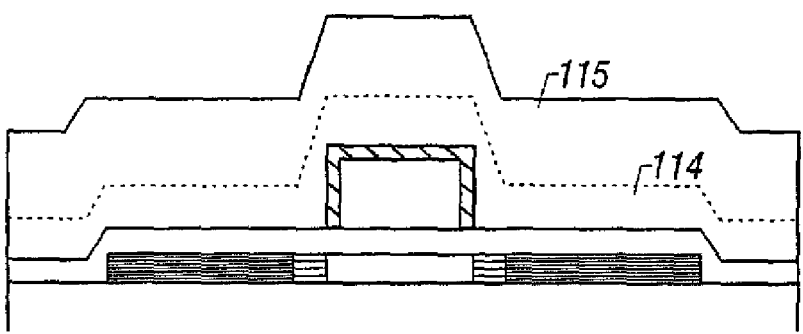

Then, as shown in FIG. 1(D), two interlayer insulating films 114 and 115 are formed by plasma CVD. In the present example, the interlayer insulating films 114 and 115 are made of silicon nitride films of different composition ratio.

At this time, the composition ratio of the silicon nitride film forming the second interlayer insulating film 115 gives a higher dry etch rate than that of the first interlayer insulating film 114. For example, the film of higher etch rate can be formed by increasing the pressure of the film-forming gas or the growth temperature or by lowering the RF power.

More specifically, where the first and second films are grown at 250° C. and 350° C., respectively, the dry etch rate of the second layer is approximately twice as high as the rate of the first layer.

The pressures of the gases for forming the first and second layers, respectively, are set to 0.3 and 0.7 torr, respectively. In this case, the dry etch rate of the second layer is about 1.5 times as high as the rate of the first layer.

Figure 3:
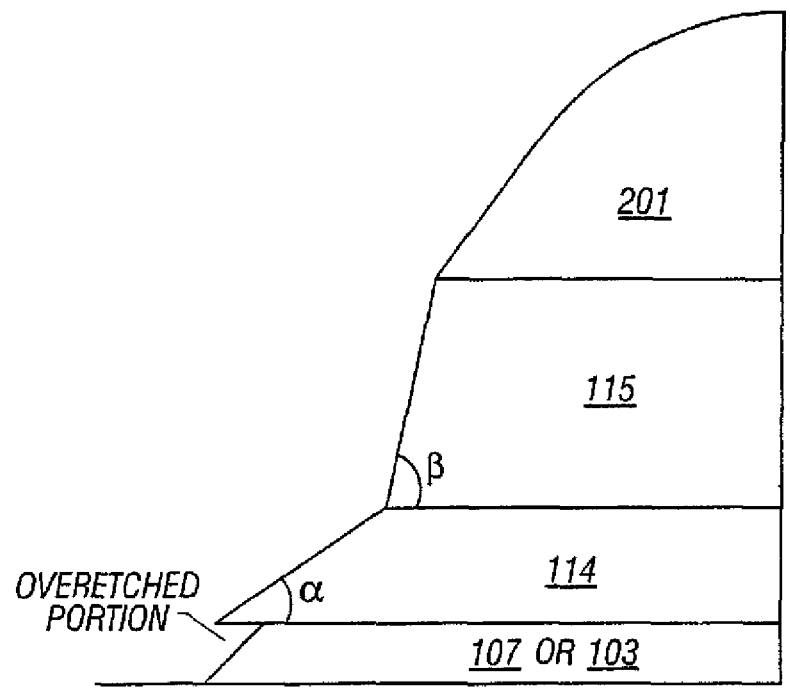
FIG. 3 is a cross-sectional view of a contact hole formed by the process sequence shown in FIGS. 1(A)-1(D) and 2(A)-2(B)

This is a requirement which must be satisfied in order that the tilt angle β of the second interlayer insulating film 115 be smaller than the tilt angle α of the first interlayer insulating film 114 in the shape of the contact hole shown in FIG. 3.

The total thickness of the first and second interlayer insulating films is 1 to 3 times as large as the thickness of the gate electrode 108 to improve the coverage of the interlayer insulating films. Thus, current leaking via the interlayer insulating films is prevented.

Preferably, the thickness of the first interlayer insulating film 114 is less than one third of the total thickness. If the thickness of the first interlayer insulating film is greater than this, the tilt angle α increases, thus resulting in difficulties in a light etching step carried out later.

Figure 2A:
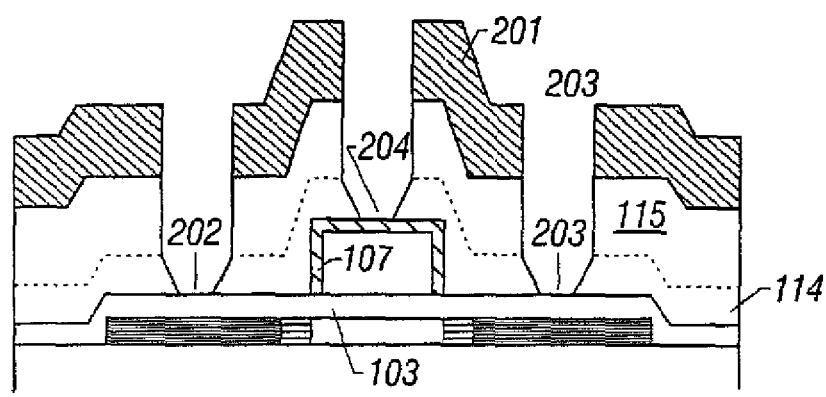

A resist mask indicated by 201 in FIG. 2(A) is formed, and a contact hole is formed by dry etching techniques. The composition of the etchant gas is so set that $CF_4:O_2=40:60$.

Figure 5:
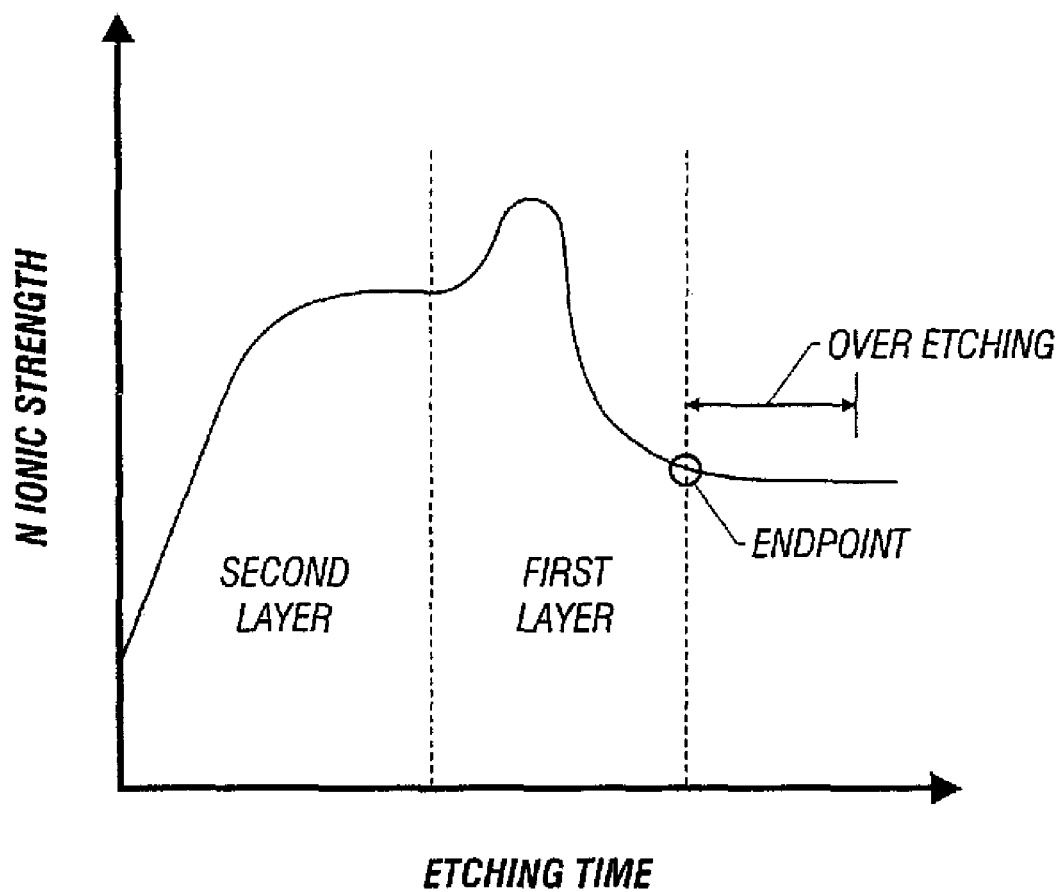
FIG. 5 is a graph illustrating the endpoint of a dry etching process.

The etching ends when a period of 150 seconds passes since the endpoint has been confirmed. The endpoint is detected as shown in FIG. 5. The signal intensity of nitrogen ions from the first layer is greater, because the first layer is denser than the second layer.

At this time, in the source/drain contact regions 202 and 203, the gate-insulating film 103 acts as a film that stops the dry etching process. In the gate electrode region 204, the anodic oxide film 107 acts as a film that stops the dry etching process.

Since the second interlayer insulating film 115 is higher in etch rate than the first interlayer insulating film 114, tapered sections are to formed as shown in FIG. 2(A).

Then, the gate-insulating film 103 at the bottom surface of the contact hole is etched with buffered hydrofluoric acid, thus completing the contact holes in the source/drain regions.

Thereafter, chromium mixed acid solution consisting of mixture of chromic acid, acetic acid, phosphoric acid, and nitric acid is used to etch the anodic oxide film 107, thus completing the contact hole in the gate electrode region.

Where the gate-insulating film 103 is etched first in this way, the gate electrode 108 can be protected, since the anodic oxide film 107 has excellent resistance to buffered hydrofluoric acid. The chromium mixed acid solution hardly attacks the source region 109 or drain region 110.

Figure 2B:
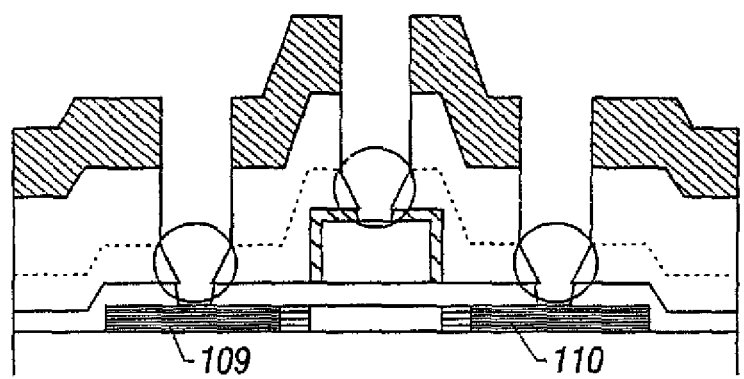

In this way, the state shown in FIG. 2(B) is obtained. Wet etching using buffered hydrofluoric acid or chromium mixed acid progresses isotropically and so overetched portions as shown in the circles of FIG. 2(B) are formed.

Figure 2C:
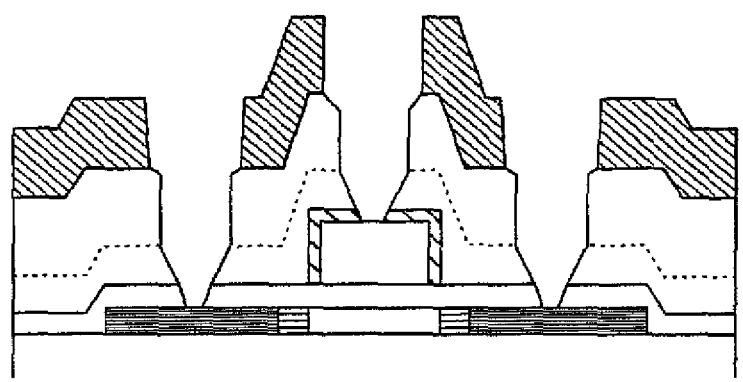

The interlayer insulating films are recessed by light etching, thus eliminating overetched portions, as shown in FIG. 2(C). At this time, as the tilt angle α of the first interlayer insulating film 114 decreases, the film can be more easily recessed.

This light etching process is carried out by dry etching techniques. The composition of the etchant gas is so set that $CF_4:O_2=25:75$. With this composition, the selectivity of silicon nitride with respect to silicon is more than 10. Hence, the surfaces of the source region 109 and drain region 110 are hardly etched.

Figure 4:
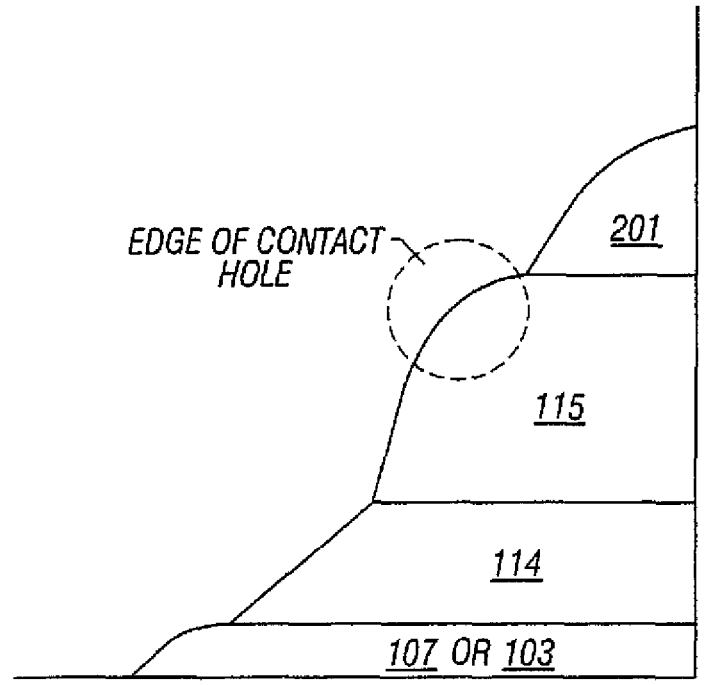
FIG. 4 is a cross-sectional view of a contact hole as shown in FIG. 2 (C) in which corners have been rounded off by a method according to the present invention.

This light etching is carried out by the gas with a high $O_2$ content. Therefore, the resist mask 201 is recessed simultaneously. Consequently, the corners of the cross-sectional shape at the edges of the contact hole are etched away and rounded off, as shown in the circle of FIG. 4.

After the completion of the contact hole, interconnect electrodes 205, 206, and 207 are formed. Then annealing is performed in a hydrogen ambient at 350° C. for 2 hours.

Figure 2D:
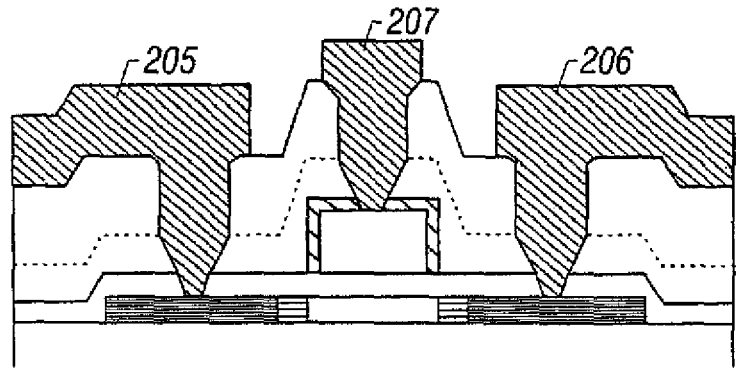

A thin-film transistor as shown in FIG. 2(D) is fabricated by performing the steps described above.

Embodiment 2

The present example is an example of application of the present invention to an IC fabrication process using single-crystal silicon wafer. More specifically, this is an example of fabrication of a MOS transistor, using the silicon wafer.

Figure 6A:
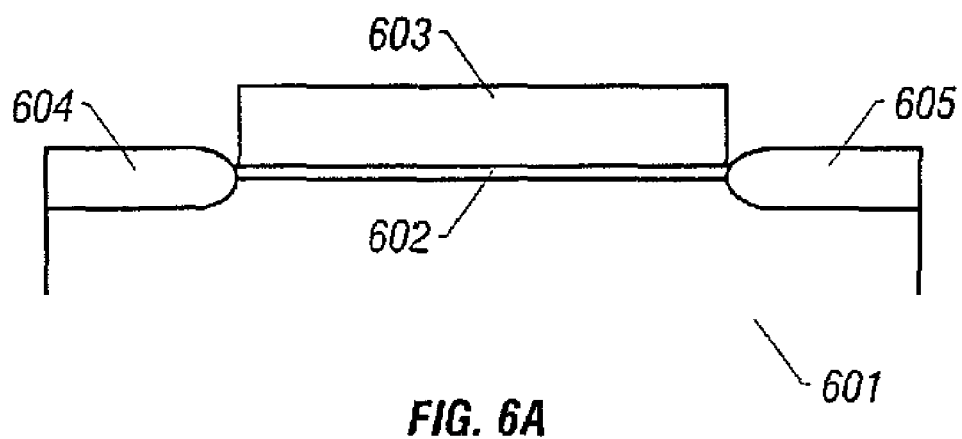
FIGS. 6(A)-6(C), 7(A)-7(B), and 8(A)-8(B) are cross-sectional views illustrating IC fabrication processes according to the invention.

The process sequence of the present invention is shown in FIGS. 6(A)-6(C), 7(A)-7(B), and 8(A)-8(B). First, as shown in FIG. 6(A), a thermal oxide film and a silicon nitride film are laminated over an N-type single-crystal silicon wafer 601 and patterned to create a patterned lamination of the thermal oxide film 602 and silicon nitride film 603.

Then, field oxide films 604 and 605 are formed by a selective thermal oxidization method. Thus, a state shown in FIG. 6(A) is obtained.

Then, the thermal oxide film 602 and the silicon nitride film 603 are removed. A thermal oxide film 606 is formed again by thermal oxidation. This thermal oxide film 606 forms a gate-insulating film.

Thereafter, a gate electrode 607 is fabricated from an appropriate metal material, silicide material, or semiconductor material. Subsequently, dopants are implanted to form source/drain regions.

In this example, boron (B) ions are introduced through ion implantation to fabricate a P-channel MOS transistor. If an N-channel MOS transistor is fabricated, phosphorus (P) ions may be introduced.

After the ion implantation described above, a heat-treatment is made to activate the introduced dopants and to anneal out damage to the semiconductor layer caused by the ion implantation.

Figure 6B:
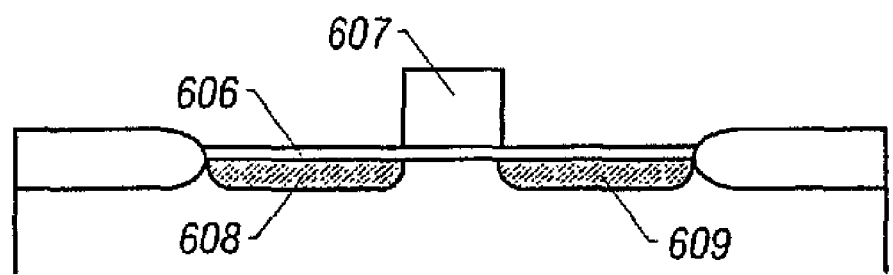

In this way, a P-type source region 608 and a drain region 609 are formed by self-aligned technology, as shown in FIG. 6(B).

Then, silicon nitride films 610 and 611 are formed as interlayer insulating films. In the same way as in Example 1, the silicon nitride films 610 and 611 have such film properties that the film 611 has a higher etch rate than the below film 610.

Figure 6C:
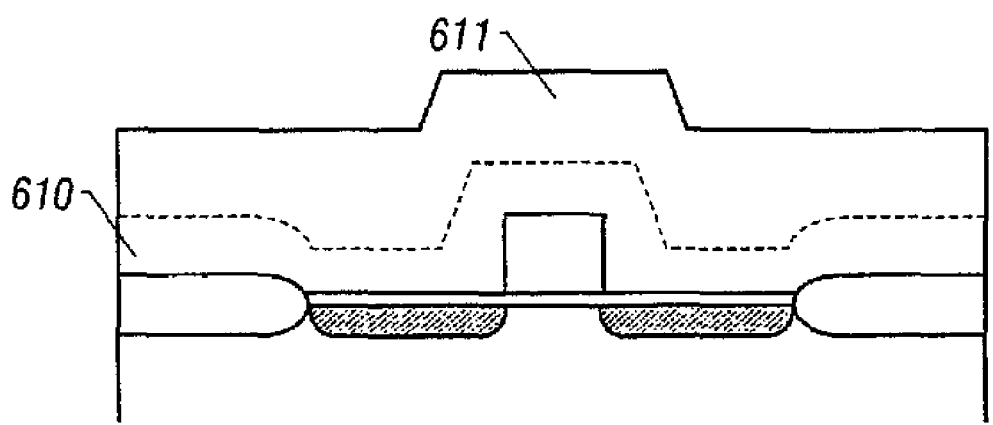
Figure 7A:
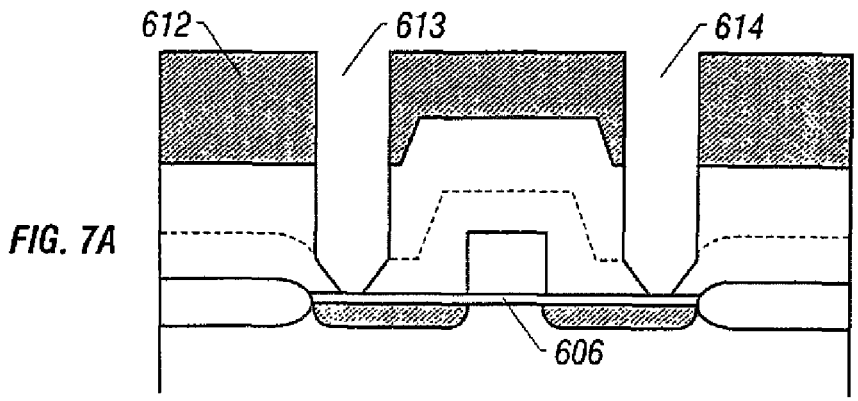

A state shown in FIG. 6(C) is obtained in this manner. Then, as shown in FIG. 7(A), a resist mask 612 is placed. Contact holes 613 and 614 are formed by dry etching techniques.

A state shown in FIG. 7(A) is obtained in this way. At this time, the gate-insulating film 606 consisting of a thermal oxide film acts as an etch stopper.

Contact holes 615 and 616 are then formed by wet etching techniques.

Figure 7B:
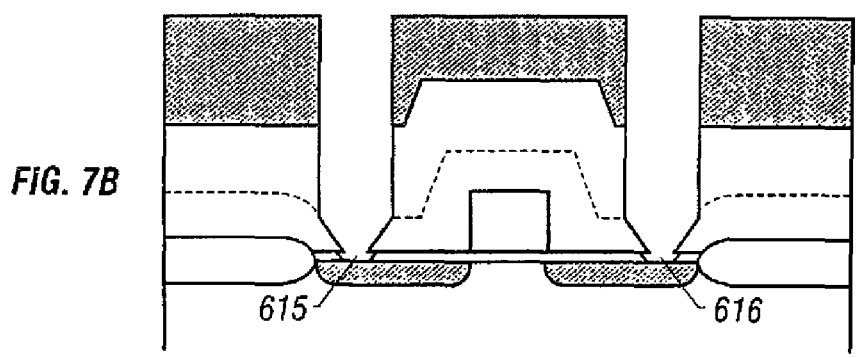

In this manner, a state shown in FIG. 7(B) is obtained. At this time, wet etching proceeds isotropically and so the contact holes 615 and 616 widen the bottoms of the contact holes 613 and 614, respectively.

Then, the interlayer insulating films and resist mask are recessed by light dry etching, using mixture of CF4 and O2. The oxygen is added because the resist mask should be recessed.

Figure 8A:
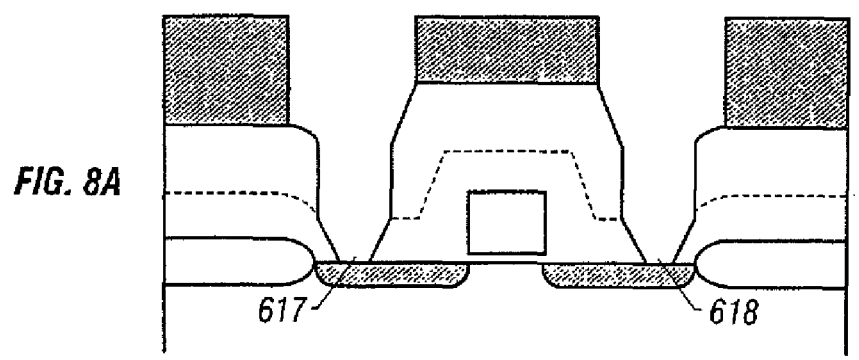
Figure 8B:
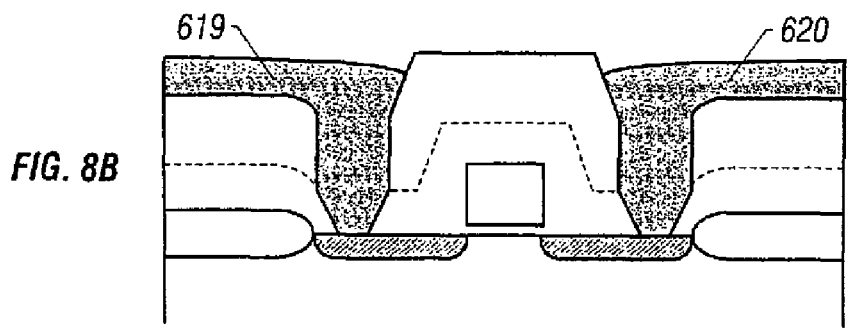

In this way, contacts having a mild cross-sectional shape as shown in FIG. 8(A) can be obtained. After obtaining the state shown in FIG. 8(A), a source electrode 619 and a drain electrode 620 are formed as shown in FIG. 8(B), thus completing a MOS transistor.

In the present invention, the interlayer insulating film is made of a multilayer structure consisting of two or more layers. The etch rate of an upper layer is made higher than that of a lower layer. Therefore, tapered section can be formed in such a way that the tilt angle decreases successively from the top layer of the interlayer insulating film toward the bottom layer.

Furthermore, undercutting of the gate-insulating film 103 and of the anodic oxide film 107 as shown in the circles of FIG. 2(B) can be prevented. In addition, the cross-sectional shape around the top of each contact hole can be improved as shown in FIGS. 2(C) and 3.

The cross-sectional shape of the contact hole can be improved greatly by the effects described above. The yield at which TFTs are fabricated and the reliability of interconnect contacts are enhanced. Concomitantly, the long-term reliability of the devices and display system can be enhanced.

What is claimed is:

1. A semiconductor device comprising:
   a semiconductor substrate including at least a source region and a drain region;
   a gate electrode over the semiconductor substrate with a gate insulating film interposed therebetween;
   a first insulating film formed over the semiconductor substrate and the gate electrode;
   a second insulating film formed on the first insulating film;
   a contact hole formed in the first and second insulating films to reach at least one of the source region and the drain region; and
   an electrode electrically connected to at least one of the source region and the drain region through said contact hole,
   wherein an edge of said contact hole is rounded off at a top of said contact hole,
   wherein an inner side surface of the first insulating film in the contact hole at a bottom of the first insulating film has a first taper angle and an inner side surface of the second insulating film in the contact hole has a second taper angle, and the first taper angle is smaller than the second taper angle,
   wherein the electrode is in contact with the first insulating film and the second insulating film in the contact hole, and
   wherein the electrode fills the contact hole, and
   wherein the electrode does not cover the top of the contact hole, which is rounded off.

2. The semiconductor device according to claim 1, wherein said semiconductor substrate is a single-crystal silicon wafer.

3. The semiconductor device according to claim 1, wherein said source region and said drain region contain phosphorus or boron.

4. The semiconductor device according to claim 1, wherein said first insulating film and said second insulating film are formed from a same material.

5. The semiconductor device according to claim 1, wherein at least any one of said first insulating film and said second insulating film are formed from silicon nitride.

6. The semiconductor device according to claim 1, wherein a composition ratio of the first insulating film is different from a composition ratio of the second insulating film.

7. The semiconductor device according to claim 1, wherein an etching rate of the first insulating film is different from an etching rate of the second insulating film.

8. The semiconductor device according to claim 1, wherein an etching rate of the second insulating film is higher than an etching rate of the first insulating film.

9. The semiconductor device according to claim 1, wherein a film property of the first insulating film is different from a film property of the second insulating film.

10. The semiconductor device according to claim 1, wherein a film thickness of the second insulating film is greater than a film thickness of the first insulating film.

11. The semiconductor device according to claim 1, wherein the gate insulating film and the first insulating film are formed from different materials.

12. The semiconductor device according to claim 1, wherein the contact hole is formed in the gate insulating film.

13. The semiconductor device according to claim 1, wherein said electrode is formed over the second insulating film.

* * * * *

UNITED STATES PATENT AND TRADEMARK OFFICE
CERTIFICATE OF CORRECTION

PATENT NO. : 8,283,788 B2
APPLICATION NO. : 12/883526
DATED : October 9, 2012
INVENTOR(S) : Hongyong Zhang It is certified that error appears in the above-identified patent and that said Letters Patent is hereby corrected as shown below:

Column 6, line 21, in "are to formed" delete "to".

Signed and Sealed this
Twenty-sixth Day of February, 2013

Teresa Stanek Rea
*Acting Director of the United States Patent and Trademark Office*